United States Patent [19]

Schiller

[11] 4,361,786
[45] Nov. 30, 1982

[54] APPARATUS FOR SYNCHRONIZING DEFLECTION SIGNAL GENERATORS TO THE CORRESPONDING SYNCHRONIZATION SIGNALS IN A TELEVISION SYSTEM

[75] Inventor: Wilfried Schiller, Hildesheim, Fed. Rep. of Germany

[73] Assignee: Blaupunkt Werke GmbH, Hildesheim, Fed. Rep. of Germany

[21] Appl. No.: 111,708

[22] Filed: Jan. 14, 1980

[30] Foreign Application Priority Data

Jan. 24, 1979 [DE] Fed. Rep. of Germany ....... 2902618

[51] Int. Cl.³ ........................ H01J 29/70; H01J 29/76
[52] U.S. Cl. .................................... 315/403; 315/389
[58] Field of Search ............... 315/403, 387, 389, 396, 315/397; 358/159

[56] References Cited

U.S. PATENT DOCUMENTS

| | | | |
|---|---|---|---|
| 3,199,045 | 8/1965 | Herick et al. | 358/159 |
| 3,593,179 | 7/1971 | Hovens et al. | 358/159 |
| 3,784,857 | 1/1974 | Christopher | 315/396 |
| 4,100,464 | 7/1978 | Ovenden | 315/397 |
| 4,166,237 | 8/1979 | Van Roessel | 315/403 |

*Primary Examiner*—Theodore M. Blum

*Attorney, Agent, or Firm*—Frishauf, Holtz, Goodman & Woodward

[57] ABSTRACT

A vertical frequency deflection signal generator includes a comparator whose output is coupled to a capacitor the voltage across which constitutes the vertical deflection voltage. The capacitor is charged from a voltage source in the vertical trace interval and discharged when the comparator output switches to ground potential, i.e. when the voltage at the inverting input of the comparator is greater than the voltage at the direct input. To synchronize such a vertical deflection signal generator to vertical synchronization pulses derived from an incoming television signal, the vertical synchronization signals are applied to the base of a transistor whose emitter-collector circuit is connected to the comparator output through a resistor. Each received vertical synchronization signal therefore causes a slight decrease in the output voltage of the comparator and, because of a feedback resistor, a corresponding decrease at the direct input of the comparator. The circuit is so balanced that a vertical synchronization signal received near the end of the trace interval will cause an early switching of the comparator, while noise pulses received other than near the end of the trace interval will have no effect.

6 Claims, 1 Drawing Figure

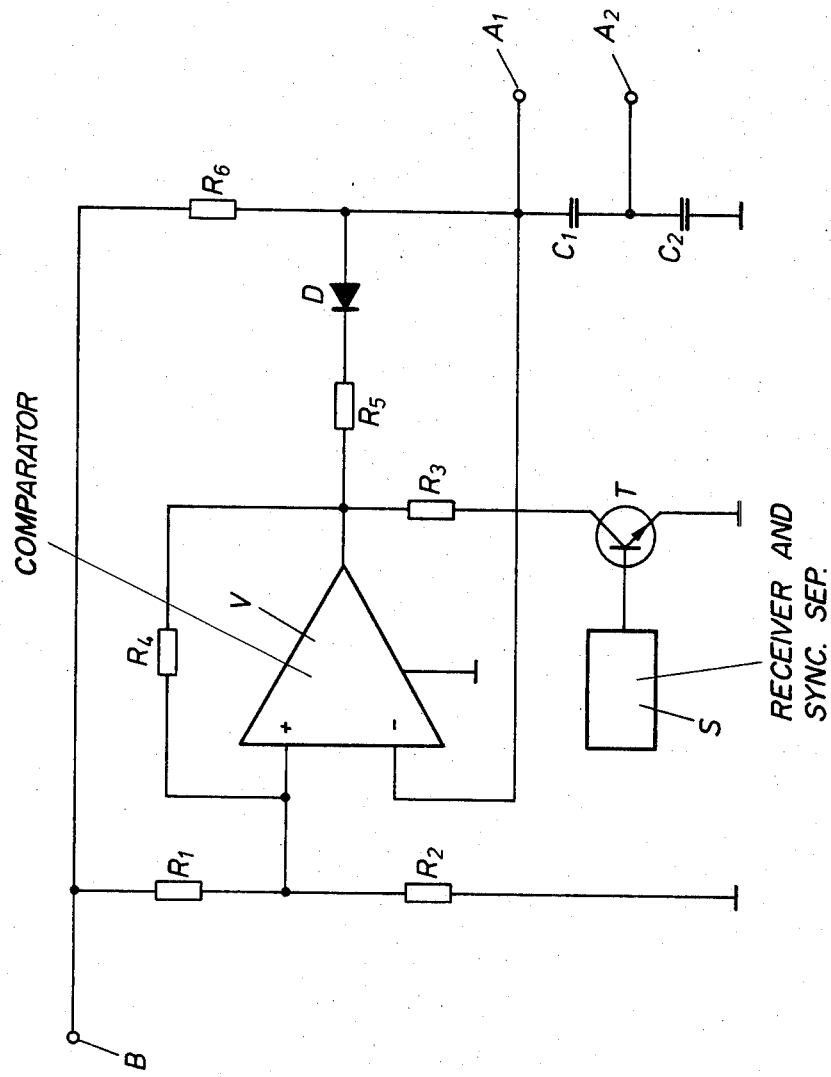

APPARATUS FOR SYNCHRONIZING DEFLECTION SIGNAL GENERATORS TO THE CORRESPONDING SYNCHRONIZATION SIGNALS IN A TELEVISION SYSTEM

The present invention relates to the synchronization of deflection signal generators to synchronization signals derived from a received television signal. In particular, it relates to systems for synchronizing the vertical deflection signal generator to such received vertical synchronization signals.

Background and Prior Art

In known systems, the vertical deflection signal generators include an amplifier and the synchronization signals are applied to one input of the amplifier, causing the amplifier output to be synchronized to the vertical synchronization signals.

This type of system is very prone to malfunction because of received noise signals.

The Invention

It is an object of the present invention to furnish a system whereby the deflection signal generator may be synchronized with the incoming vertical synchronization signals with less susceptibility to noise than the previously known systems. It is a further object of the present invention to furnish such a system which can be readily applied to vertical deflection signal generators presently in use.

The present invention is particularly appropriate where the television signals are received with a very low signal-to-noise ratio.

According to the present invention, the synchronization signals separated from the incoming television signal are applied to a circuit which is interconnected between the output terminal of the amplifier furnishing the vertical deflection signal and the output terminal of the synchronization signal separator so that the output terminal of the deflection circuit is shunted in response to each synchronization signal.

DRAWING ILLUSTRATING A PREFERRED EMBODIMENT:

The single FIGURE is a circuit diagram of the synchronization circuit of the present invention. Referring now to the FIGURE, the output of a comparator V is connected through a resistor R5 and a diode D to a terminal A1 which is one end of a series circuit including a capacitor C1 and a capacitor C2. Terminal A1 is connected to one terminal of capacitor C1, while the terminal of capacitor C2 not connected to capacitor C1 is connected to ground potential. The inverting input of comparator V is also connected to terminal A1. Capcitors C1 and C2 are charged from a voltage source B through a resistor R6 during the vertical trace interval and are discharged through diode D and resistor R5 during the vertical retrace interval, during which time the output of comparator V is at substantially ground potential. For feedback, the output of comparator V is connected to the direct input through a resistor R4. Comparator V is thus a feedback amplifier. The direct input of comparator V is further connected to the voltage divider tap of a voltage divider fed from voltage source B and including resistors R1 and R2.

The vertical deflection signal generator is thus an RC oscillator whose frequency is determined by the magnitudes of resistor R6 and capacitors C1 and C2.

In accordance with the invention, series circuit including a resistor R3 and the collector-emitter circuit of a transistor T is connected in shunt with the output of comparator V. The collector-emitter circuit of transistor T is switched to the conductive state by the synchronization signals furnished at the output of the receiving and synchronization signals separating circuit S. In particular, transistor T is switched to the conductive state by vertical synchronization signals.

Terminl A1 forms the output terminal of the vertical deflection signal generator. A sawtooth voltage of vertical frequency can be derived at this terminal. This voltage may be amplified in subsequent amplification stages which are not illustrated. Additional linearization of the voltage available at terminal A1 can be accomplished by feeding back a signal from the output of these further amplification stages to terminal A2.

Operation:

As soon as the voltage across capacitors C1 and C2 and therefore the voltage at the inverting input of comparator V exceeds the voltage at the direct input of comparator V, the output of comparator V is switched to ground potential. The output of comparator V is therefore switched to a low resistance state and the voltage at this output becomes much more negative. The voltage at the direct input of comparator V therefore also becomes more negative, reinforcing the switching of the comparator. When the output of comparator V is fully conductive, that is at ground potential, resistors R2 and R4 are connected in parallel.

During the time that the ouput of comparator V is at ground potential, capacitors C1 and C2 are discharged through diode D and resistor R5. This discharge of the capacitors causes the voltage at the inverting input of comparator V to decrease.

As soon as the voltage across capacitors C1 and C2 and therefore at the inverting input of comparator V is less than the voltage at the direct input, comparator V blocks, that is its output is no longer at ground potential. At this point, diode D also blocks and capacitors C1 and C2 are charged through resistor R6 until the voltage at the inverting input of comparator V again exceeds the voltage at the direct input of comparator V and comparator V again switches to the conductive state. The vertical deflection signal generator thus acts as a free-running oscillator. The charging time of capacitors C1 and C2, that is the vertical trace interval is determined by the magnitude of resistor R6, while the discharge time of capacitors C1 and C2, that is the vertical retrace interval, is determined in the main by the resistance of resistor R5.

As previously mentioned, the vertical synchronization signals derived from the received television signal are available at the output of stage S. These pulses are used to switch transistor T to the conductive state.

During the time determined by the width of the vertical synchronization pulses, resistor R2 and the series circuit including resistors R3 and R4 are connected in parallel, since transistor T is in the conductive state. The voltage at the direct input of comparator V therefore decreases to a value determined by the resistances of resistors R1, R2, R3 and R4. If, in the presence of vertical synchronization pulse, the voltage at the inverting input of comparator V exceeds the voltage determined by resistors R1, R2, R3 and R4, the output of comparator V is connected to ground potential, so that capacitors C1 and C2 are discharged through comparator V.

In the presence of a synchronization pulse at the output of stage S, comparator V is thus switched to the conductive state earlier than it would be in the absence of such a pulse. The free-running vertical deflection signal oscillator is thus synchronized to the synchronization pulses provided at the output of stage S and oscillates at the vertical deflection frequency.

It will be noted that noise pulses which appear in the presence of a vertical synchronization pulse do not have any effect on the phase and frequency of the vertical deflection signal generator since the output of comparator V is short-circuited in any case.

By correct dimensioning of the resistance values of resistors R1, R2, R3 and R4 the effect of noise pulses which occur during the vertical trace interval can also be eliminated. Noise pulses which occur during the vertical trace interval cause a decrease of voltage at the direct input of comparator V which is limited by the values of the resistances R1, R2, R3 and R4 and of course the value of the supply voltage B. The amplitude of the voltage decrease is independent of the amplitude of the noise pulse. The voltage at the inverting input of comparator V does not exceed this decreased voltage at the direct input of comparator V during the trace interval. On the contrary, the voltage at the inverting input of comparator V exceeds the voltage at the direct input only near the end of the trace interval, so that comparator V will be switched to the conductive state thereby initiating the retrace interval only at or near the end of the trace interval. A correct synchronization of the vertical deflection signal generator to the vertical synchronization signals is thus achieved.

The system of the present invention can be applied to the vertical deflection circuits of all presently known television receivers. It may for example be incorporated into vertical deflection circuits in which the deflection currents required for the vertical deflection are derived from energy available in the horizontal deflection circuit. In this type of circuit, controllable switches at the output of the horizontal deflection circuits are switched to the conductive state in dependence on horizontal frequency pulses modulated in their pulse width by vertical frequency sawtooth signals.

The output signals of the vertical deflection signal generator synchronized in accordance with the present invention are independent of noise pulses with respect to frequency, amplitude and phase and, in particular, with respect to the phase at the beginning and end of the trace and retrace intervals. An effective and reliable synchronization of the vertical deflection signal generator to the vertical synchronization signals is achieved and the effect of noise pulses is eliminated.

Various changes and modifications may be made within the scope of the inventive concepts.

Circuit constants in an Exemplary Embodiment $R_1 = 5.1$ K$\Omega$
$R_2 = 33$ K$\Omega$
$R_3 = 10$ K$\Omega$
$R_4 = 2.6$ K$\Omega$
$R_5 = 1$ K$\Omega$
$R_6 = 100$ K$\Omega$
$C_1 = 0.47$ $\mu$F
$C_2 = 0.47$ $\mu$F Width of vertical synchronization pulses 150 microseconds

I claim:

1. Apparatus for providing vertical deflection control signals in television equipment in synchronization with vertical synchronization signals separated from a television signal by a synch-separator circuit and subject to noise interference, comprising:

a vertical deflection wave generator constituted by a differential amplifier (V) provided with positive feedback means ($R_4$) for maintaining oscillation by said amplifier and deflection wave forming means ($R_5, R_6, D, C_1, C_2$) including at least one capacitor and having inputs and an output, said deflection wave forming means having a deflection wave output connection ($A_1$) to which said at least one capacitor ($C_1$) is connected, and having also means ($B, R_6$) for charging said capacitor during the television vertical trace interval and means ($R_5, D$) interconnected with said output connection, amplifier output and an input of said amplifier for causing discharge of said at least one capacitor during the television retrace interval, and means ($R_3, T$) for applying the vertical synchronization signal output of said synch-separator circuit (S) to the output of said amplifier (V) for advancing the discharge of said at least one capacitor and thereby synchronizing, with substantial immunity to noise effects, the wave produced at said deflection wave output.

2. Apparatus as set forth in claim 1, wherein said synchronizing signal applying means comprises controllable switch means (T), having a control electrode connected to said synch-separator circuit output, for connecting said output of said amplifier (V) through said controllable switch means (T) to a predetermined reference potential in response to each of said vertical synchronization signals.

3. Apparatus as set forth in claim 2, wherein said controllable switch means comprises a transistor having an emitter-collector path connected in circuit between said output of said amplifier and said predetermined reference potential.

4. Apparatus as set forth in claim 3, wherein a resistor ($R_3$) is connected in circuit with said transistor path between said amplifier and said reference potential.

5. Apparatus as set forth in claim 1, in which said amplifier (V) has noninverting and inverting inputs, said positive feedback means is connected between said output of said amplifier and said noninverting input, and said deflection wave forming means includes a connection to said noninverting input.

6. Apparatus as set forth in claim 1, in which said wave forming means includes a plurality of capacitors ($C_1, C_2$) in series between said deflection wave output connection ($A_1$) and said reference potential, and said reference potential is chassis ground potential of said television equipment.

* * * * *